United States Patent
Li et al.

(10) Patent No.: US 7,647,447 B2
(45) Date of Patent: Jan. 12, 2010

(54) DATA BUS CONNECTION FOR MEMORY DEVICE

(75) Inventors: Hua Li, Singapore (SG); Yuan Fuat Chin, Singapore (SG)

(73) Assignee: Thomson Licensing, Boulogne-Billancourt (FR)

(*) Notice: Subject to any disclaimer, the term of this patent is extended or adjusted under 35 U.S.C. 154(b) by 895 days.

(21) Appl. No.: 10/496,920

(22) PCT Filed: Nov. 21, 2002

(86) PCT No.: PCT/EP02/13068

§ 371 (c)(1),
(2), (4) Date: May 27, 2004

(87) PCT Pub. No.: WO03/047322

PCT Pub. Date: Jun. 5, 2003

(65) Prior Publication Data

US 2005/0033865 A1 Feb. 10, 2005

(30) Foreign Application Priority Data

Nov. 29, 2001 (EP) ................................ 01403063

(51) Int. Cl.
*G06F 13/00* (2006.01)
*G11C 5/02* (2006.01)
*G06F 17/50* (2006.01)

(52) U.S. Cl. ........................ 710/316; 365/51; 716/10; 716/11; 716/12; 716/13; 716/14

(58) Field of Classification Search ............... 710/316, 710/305; 719/326; 365/51; 713/2; 716/10–14
See application file for complete search history.

(56) References Cited

U.S. PATENT DOCUMENTS 5,015,191 A * 5/1991 Grabbe et al. ................. 439/71
5,096,852 A * 3/1992 Hobson ........................ 29/827

(Continued)

FOREIGN PATENT DOCUMENTS

| JP | 491731 A | 1/1974 |
|----|----------|--------|
| JP | 1143387 A | 6/1989 |
| JP | 6048077 A | 2/1994 |
| JP | 6326500 A | 11/1994 |
| JP | 2000133895 A | 5/2000 |

OTHER PUBLICATIONS

IBM, Single-layer automatic router, Jun. 30, 1998, IBM Research.*

*Primary Examiner*—Mark Rinehart
*Assistant Examiner*—Christopher A Daley
(74) *Attorney, Agent, or Firm*—Robert D. Shedd; Joseph J. Opalach; Reitseng Lin

(57) ABSTRACT

A data bus of a DVD+RW recorder between a DSP and a SDRAM usually needs a multilayer wiring board. In order to simplify the layout of the wiring board of the data bus there is provided a method for connecting at least a first and a second integrated circuit by providing the first integrated circuit having a plurality of first logical I/O ports physically arranged in a first order at the periphery, and providing the second integrated circuit having a plurality of second logical I/O ports physically arranged in a second order at the periphery, wherein each first I/O port is to be connected to one of said second I/O ports. The first and second I/O logical ports are connected independently from the first and/or second physical order, so that connection lines do not cross each other.

7 Claims, 2 Drawing Sheets

U.S. PATENT DOCUMENTS

| | | | | |
|---|---|---|---|---|
| 5,815,427 A * | 9/1998 | Cloud et al. | ................... | 365/51 |
| 6,225,689 B1 * | 5/2001 | Moden et al. | ............... | 257/686 |
| 6,256,769 B1 * | 7/2001 | Tamarkin et al. | .............. | 716/12 |
| 6,258,623 B1 * | 7/2001 | Moden et al. | ................ | 438/106 |
| 6,313,493 B1 * | 11/2001 | Mori et al. | .................. | 257/296 |
| 7,113,417 B2 * | 9/2006 | Pochmuller | .................. | 365/51 |

* cited by examiner

DATA BUS CONNECTION FOR MEMORY DEVICE

This application claims the benefit, under 35 U.S.C. § 365 of International Application PCT/EP02/13068, filed Nov. 21, 2002, which was published in accordance with PCT Article 21(2) on Jun. 5, 2003 in English and which claims the benefit of European patent application No. 01403063.9 filed Nov. 29, 2001.

The present invention relates to a device and method for connecting a first and a second integrated circuit by providing the first integrated circuit having a plurality of first I/O ports physically arranged in a first order at the periphery, and providing the second integrated circuit having a plurality of second I/O ports physically arranged in a second order at the periphery, wherein each first I/O port is to be connected to one of the second I/O ports. Particularly the present invention relates to a method to interconnect a SDRAM (Synchronous DRAM) and a DSP (Digital Signal Processor).

In many DSP solutions a standard SDRAM is needed to store the data generated by the DSP. This data, one field, will be read back by the DSP on demand.

The standard SDRAM, however, is designed for PC industry. Thus, the pinning of the I/O ports of the SDRAM, e.g. MT48LC2M32B2 from Micron, has the following order: DATA0 to DATA7, DATA16 to DATA23, DATA24 to DATA31 and DATA8 to DATA15.

Typically, controllers for controlling a DVD+RW include such standard SDRAM and a DSP. The DSP usually is designed such that the pinning has the simple sequence of DATA0 to DATA31 like in the case of FLI2200 from Faroudja.

In order to establish a data bus between such a DSP and SDRAM there have to be provided data lines crossing each other. For this at least two sides of a printed wiring (or printed circuit board: PCB) board with more than 32 vias in the present case are used.

Figure 1:
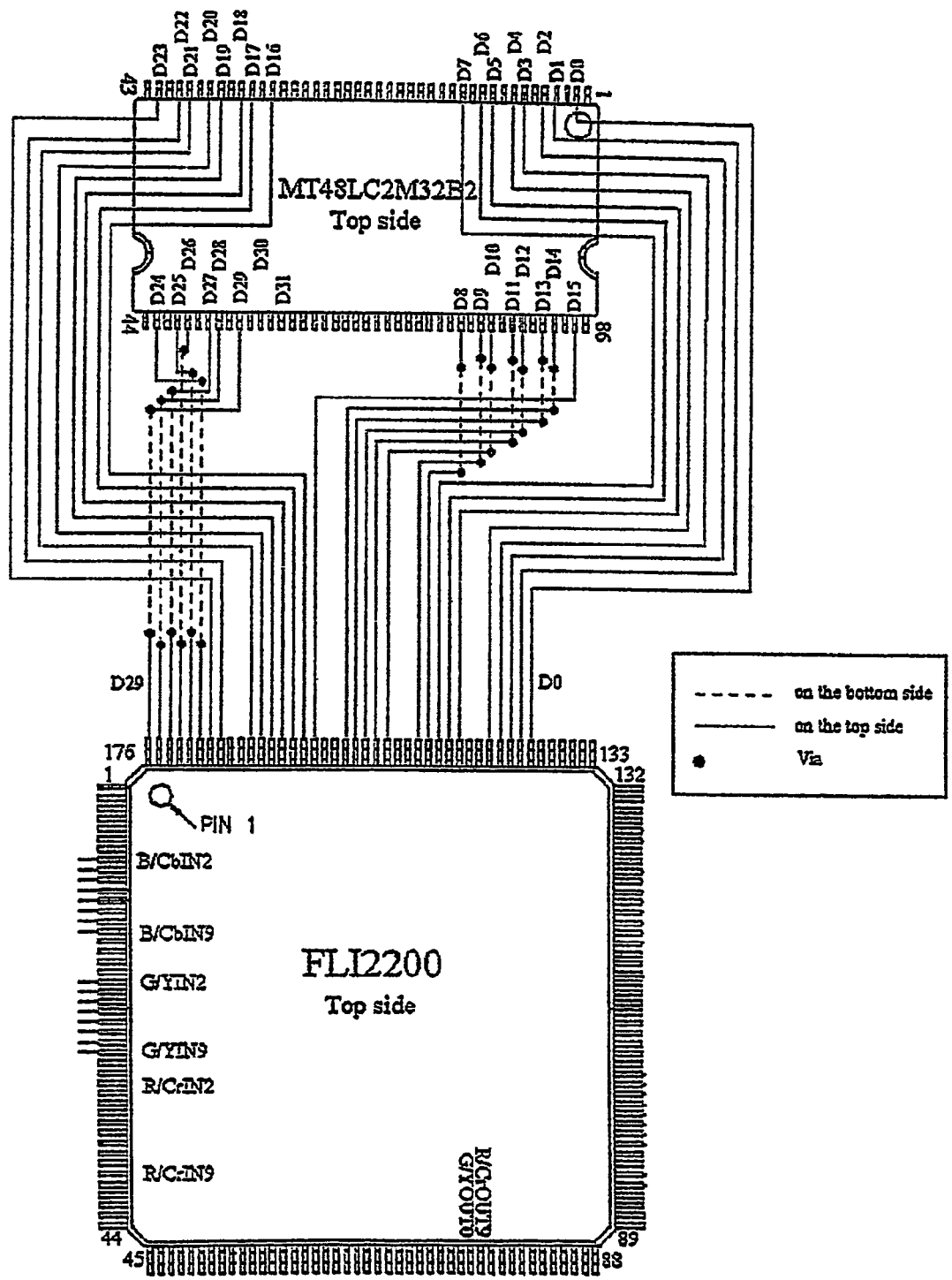

The wiring of the present example is shown in FIG. 1. The pins of the SDRAM MT48LC2M32B2 have a physical order from pin 1 to pin 86 counter clockwise. Similarly the pins of the DSP FLI2200 are physically arranged in the order of pin 1 to pin 176 counter clockwise. In the case of the DSP the logical order of the I/O ports (data bits) corresponds to the physical order of the data pins in principle. However, in the case of the SDRAM, the logical order of the I/O ports (data bits, for instance from less significant bit LSB to most significant bit MSB) is different from the physical order of the data pins. In the present case four blocks of total 32 I/O ports are arranged in zig-zag manner along the periphery of the IC device. Therefore, the pins showing in downward direction of the figure have to be lead to the bottom side of the wiring board by vias, in order to avoid crossings on the top side of the wiring board.

Such wiring enables interconnection of the I/O ports in the following way:

| FLI2200 | MT48LC2M32B2 |
|---|---|
| D0 | D0 |
| D1 | D1 |
| D2 | D2 |
| . | . |
| . | . |
| . | . |
| D28 | D28 |
| D29 | D29 |
| D30 | D30 |
| D31 | D31 |

In the above table the pin for the I/O port DATA0 is called D0, etc.

The wiring for establishing a data bus between the FLI2200 and MT48LC2M32B2 or similar devices are comparatively difficult. Thus, the manufacturing of corresponding wiring boards is expensive.

In view of the above it is the object of the present invention to provide a method and a device for connecting at least a first and a second integrated circuit in a simpler form.

According to the present invention this object is solved by a method for connecting at least a first and a second integrated circuit by providing said first integrated circuit having a plurality of first logical I/O ports physically arranged in a first order at the periphery, providing said second integrated circuit having a plurality of second logical I/O ports physically arranged in a second order at the periphery, wherein each first logical I/O port is to be connected to one of said second logical I/O ports, and connecting said first I/O ports with said second I/O ports independent from said first and/or second physical order so that connection lines do not cross each other.

Furthermore, the above object is solved by a device for connecting at least a first and a second integrated circuit including a first wiring site for receiving a plurality of first I/O pins, corresponding to first logical I/O ports, physically arranged in a first order at the periphery of the first integrated circuit, a second wiring site for receiving a plurality of second I/O pins, corresponding to second logical I/O ports, physically arranged in a second order at the periphery of the second integrated circuit, and connecting means for connecting each first I/O pin to one of said second I/O pins, whereby said connecting means includes connection lines not crossing each other, so that said first I/O pins are connectable with said second I/O pins independent from said first and/or second physical order.

Further favourable developments of the inventive device and method are defined in the sub-claims.

The invention also proposes a printed circuit board carrying at least a first and a second integrated circuits, the first integrated circuit having first data pins corresponding each to a logical data bit and arranged along its periphery, thereby defining a first data bit list, the second integrated circuit having second data pins corresponding each to a logical data bit and arranged along its periphery, thereby defining a second data bit list having an order different from the first data bit list, wherein connection lines connect each first data pin to a second data pin and wherein the connection lines are realised on a planar surface of the printed circuit board at a distance from one another.

The advantage of the present invention is that it is possible to establish a data bus between a SDRAM and a DSP without crossings between data lines.

Figure 2:
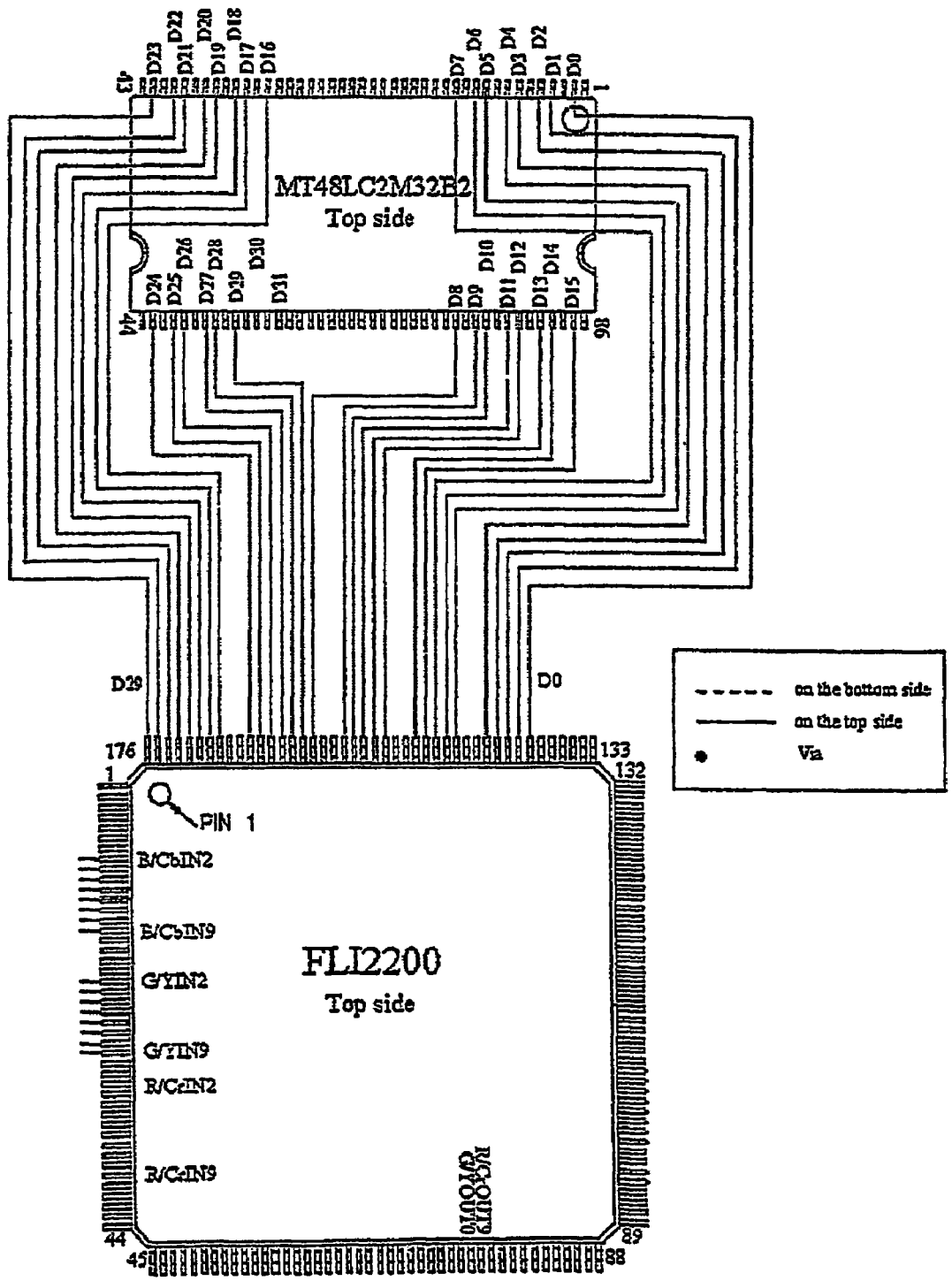

The present invention will now be explained in more detail along with the attached drawings showing in:

FIG. 1 the layout of a data bus for connecting a SDRAM and a DSP according to the prior art; and FIG. 2 the layout of a data bus for connecting the SDRAM and the DSP according to the present invention.

The following description serves for depicting favourable embodiments of the present invention.

FIG. 2 shows the layout of a wiring board for connecting a SDRAM MT48LC2M32B2 and a DSP FLI2200. Both integrated circuits are shown from their topside. The pin configuration of both integrated circuits is the same as that descript in connection with FIG. 1. However, according to FIG. 2 the data lines are simply drawn according to geometrical aspects independent from the arrangement of the logical I/O ports of both integrated circuits. Thus, there is no crossing necessary between all data lines.

As the configuration of MT48LC2M32B2 is 2Meg×32 Bit all the 32 Bit data from FLI2200 is written to the SDRAM at the same time, and also read back at the same time. Thus, the written position and the reading position of the data I/O ports of the SDRAM are the same. Therefore, the interconnection between SDRAM and DSP can be done in the following way:

| FLI2200 | MT48LC2M32B2 |
|---------|--------------|
| D0      | D1           |
| D1      | D0           |
| D2      | D2           |
| .       | .            |
| .       | .            |
| .       | .            |
| D28     | D28          |
| D29     | D29          |
| D30     | D30          |
| D31     | D31          |

That is, any data line of DSP can be connected to any data I/O port of the SDRAM. According to the above table in the writing period D0 of FLI2200 is written to D1 of SDRAM, but in the reading period, D1 of SDRAM is read back to FLI2200 as D0. So the FLI2200 writes D0 to the "wrong" position and reads D0 from the same "wrong" position. Consequently, the FLI2200 gets the "right" data.

The above principle can be applied to any pin configuration as shown in FIG. 2. Thus, for example, logical I/O port D23 of the SDRAM is connected to logical I/O port D29 of the DSP.

As a result, vias through the wiring board and wiring on the bottom side of the wiring board are not necessary and a simple layout is guaranteed.

The invention claimed is:

1. Method for connecting at least a first integrated circuit and a second integrated circuit by providing said first integrated circuit having a plurality of first logical I/O ports, and providing said second integrated circuit having a plurality of second logical I/O ports, said method comprising steps of:
   connecting said first logical I/O ports with said second logical I/O ports independent from any correspondence of said first and second logical I/O ports; and
   arranging connection lines on a single planar surface at a distance from one another,
   wherein said first logical I/O ports D0 to D31 are physically arranged in the following order: D0 to D7, D16 to D23, D24 to D31 and D8 to D15.

2. Device for connecting at least a first integrated circuit and a second integrated circuit, said device comprising:
   a first wiring site for receiving a plurality of first I/O pins, corresponding to first logical I/O ports of said first integrated circuit,
   a second wiring site for receiving a plurality of second I/O pins, corresponding to second logical I/O ports of said second integrated circuit, and
   connection lines for connecting each first I/O pin to one of said second I/O pins,
   wherein said connection lines are arranged on a single planar surface at a distance from one another and said first I/O pins are connectable with said second I/O pins independent from any correspondence of said first and second logical I/O ports, and
   wherein said first logical I/O ports D0 to D31 are physically arranged in the following order: D0 to D7, D16 to D23, D24 to D31 and D8 to D15.

3. Device for connecting at least a first integrated circuit and a second integrated circuit, said device comprising:
   a first wiring site for receiving a plurality of first I/O pins, corresponding to first logical I/O ports of said first integrated circuit,
   a second wiring site for receiving a plurality of second I/O pins, corresponding to second logical I/O ports of said second integrated circuit, and
   connection lines for connecting each first I/O pin to one of said second I/O pins, wherein said connection lines are arranged on a single planar surface at a distance from one another and said first I/O pins are connectable with said second I/O pins independent from any correspondence of said first and second logical I/O ports realized by changing a physical order of one of said first logical I/O ports and said second logical I/O ports.

4. Device according to claim 3, wherein said first integrated circuit is a SDRAM.

5. Device according to claim 3, wherein said second integrated circuit is a digital signal processor.

6. Device according to claim 3, wherein said second logical I/O ports D0 to D31 are physically arranged consecutively as in one of the following order: D0 to D31 and D31-D0.

7. Device according to claim 6, wherein said first logical I/O ports D0 to D31 are physically arranged non-consecutively.

* * * * *

UNITED STATES PATENT AND TRADEMARK OFFICE
CERTIFICATE OF CORRECTION

PATENT NO.       : 7,647,447 B2                                Page 1 of 1
APPLICATION NO.  : 10/496920
DATED            : January 12, 2010
INVENTOR(S)      : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1176 days.

Signed and Sealed this

Sixteenth Day of November, 2010

David J. Kappos
*Director of the United States Patent and Trademark Office*